United States Patent
Hernandez et al.

[11] Patent Number: 5,999,668
[45] Date of Patent: Dec. 7, 1999

[54] CERAMIC FIBER OPTIC CURRENT SENSOR

[75] Inventors: Edward Hernandez, Austin, Tex.; Trevor Wayne MacDougall, Simsbury, Conn.

[73] Assignee: 3M Innovative Properties Company, Saint Paul, Minn.

[21] Appl. No.: 09/328,070

[22] Filed: Jun. 8, 1999

Related U.S. Application Data

[62] Division of application No. 08/780,610, Jan. 8, 1997, Pat. No. 5,935,292.

[51] Int. Cl.[6] ........................................................ G02B 6/00
[52] U.S. Cl. ............................................. 385/12; 385/135
[58] Field of Search ............................... 385/12, 13, 134, 385/135; 65/402, 404, 378, 504; 250/227.14, 227.17; 356/350

[56] References Cited

U.S. PATENT DOCUMENTS

| | | | |
|---|---|---|---|
| 5,247,603 | 9/1993 | Vidacovich et al. | 385/135 |
| 5,375,185 | 12/1994 | Hermsen et al. | 385/135 |
| 5,492,552 | 2/1996 | Cronk et al. | 65/504 |
| 5,570,449 | 10/1996 | Hutchinson et al. | 385/134 |
| 5,645,622 | 7/1997 | Cronk et al. | 65/378 |
| 5,732,167 | 3/1998 | Ishiko et al. | 385/12 |

FOREIGN PATENT DOCUMENTS

| | | |
|---|---|---|
| 0 490 644 A1 | 12/1991 | European Pat. Off. . |
| WO 95/07477 | 3/1995 | WIPO . |

OTHER PUBLICATIONS

F.D.M. Haldane, "Path dependence of the geometric rotation of polarization in optical fibers", Nov. 1986, pp. 730–732, Optics Letters, vol. 11, No. 11.

M.V. Berry, "Interpreting the anholonomy of coiled light", Mar. 1987, pp. 227–278, Letters to Nature, vol. 326.

"Fiber Optic Current Sensor Module", 3M Specialty Optical Fibers, Jan. 30, 1996.

*Primary Examiner*—Hemang Sanghavi
*Attorney, Agent, or Firm*—Matthew B. McNutt

[57] ABSTRACT

An annealing mold and fiber retaining device includes a fiber holding plate having fiber channels and an annealing insert. Retainers are provided for attachment to the plate to retain fibers in the channels. After annealing, the annealing insert is replaced by a packaging insert. The fiber holding plate is mounted between a support plate and a cover plate. The mounted plates include a coextensive current conductor port and the plates are mounted in a housing which includes vibration mounts for isolating the plates from vibration within the housing.

8 Claims, 7 Drawing Sheets

CERAMIC FIBER OPTIC CURRENT SENSOR

This is a divisional of application Ser. No. 08/780,610 filed Jan. 8, 1997 now U.S. Pat. No. 5,935,292.

BACKGROUND OF THE INVENTION

This invention relates generally to holding and supporting articles being heated in an annealing oven, and more particularly to a form or holder which retains a coiled optical fiber during an annealing process, and is subsequently incorporated into a coil assembly for a Faraday-effect magnetic field sensor.

Previously, a holder was provided for annealing fiber optic coils which included a silica cylinder or ring on a silica substrate such as a flat plate. The fiber was wound around the cylindrical wall of the ring. The ring and substrate included a hole to allow passage of a conductor whereby the ring and substrate were retained with the fiber coil and incorporated into a Faraday-effect sensor package. The plate included one or more channels sandblasted or ground therein to retain the fiber ends during annealing, or included other surface structures for supporting the fiber ends. The substrate functioned as another ring which supported the first ring in a vertical position, allowing the fiber ends to hang downward during annealing.

Alternatively, the holder was in the form of a coiled tube also formed of silica. The fiber coil was annealed in the tube, and the coil and tube retained together as a subassembly. Alternatively, the tube served to protect the coil. The tube could have a sufficiently high pitch to space adjacent loops in the coil far enough apart to allow placement of the subassembly around an endless current carrying conductor. Additional quartz tubes could be used to protect the ends of the fiber coil, which were spliced to polarizing (Pz) or polarization maintaining (Pm) fibers, and to align the ends of the coiled silica tube. Means were also provided to ensure that the ends of the fiber coil were rotationally aligned at the proper angle to the Pz or Pm fibers.

Although previous packaging methods have used helical quartz tubing or flat silica plates with channels as the annealing mold and holder for the sensing fiber, the helical quartz tube allowed the fiber to move out-of-plane causing vibration sensitivity and allowing for small twisting of the fiber thus significantly affecting performance. Efforts to alleviate this problem have been cumbersome and largely ineffective. Moreover, the use of a helical coil introduced a change in the polarization state of light along the sensing fiber due to a phenomenon called Berry's Phase. This phenomenon produced a rotation in the polarization state (with high variability from coil to coil) and necessitated on-line measurement of the polarization state at the output of the sensing fiber, thereby increasing the complexity of the process. A flat coil, i.e. substantially no helix angle, removes this problem. The flat silica plate with channels was costly to manufacture and limited the design flexibility. Both of these previous methods required external packaging elements to hold the polarizing fibers. In addition, the method of orienting the polarizing fibers and splicing the annealed fibers for the helical tube approach was cumbersome.

Therefore, what is needed is an apparatus and method for retaining optical coils during an annealing process and during use of the coils in an assembly for a Faraday-effect magnetic field sensor. It is also highly desirable to protect the fibers from external forces as due to handling, vibration and impact.

SUMMARY OF THE INVENTION

The present invention, accordingly, provides an apparatus for holding and supporting articles being heated in an annealing oven, and more particularly to a form or holder which retains a coiled optical fiber during an annealing process, and is subsequently incorporated into a coil assembly for a Faraday-effect magnetic field sensor.

To this end, an annealing mold and fiber retainer device includes a fiber holding plate having a plurality of fiber channels formed therein. An insert is removably mounted on the fiber holding plate. Means are provided for locking the insert to the plate. Retainers attach to the plate to secure the fibers in the channels.

DESCRIPTION OF THE PREFERRED EMBODIMENT

Figure 1:
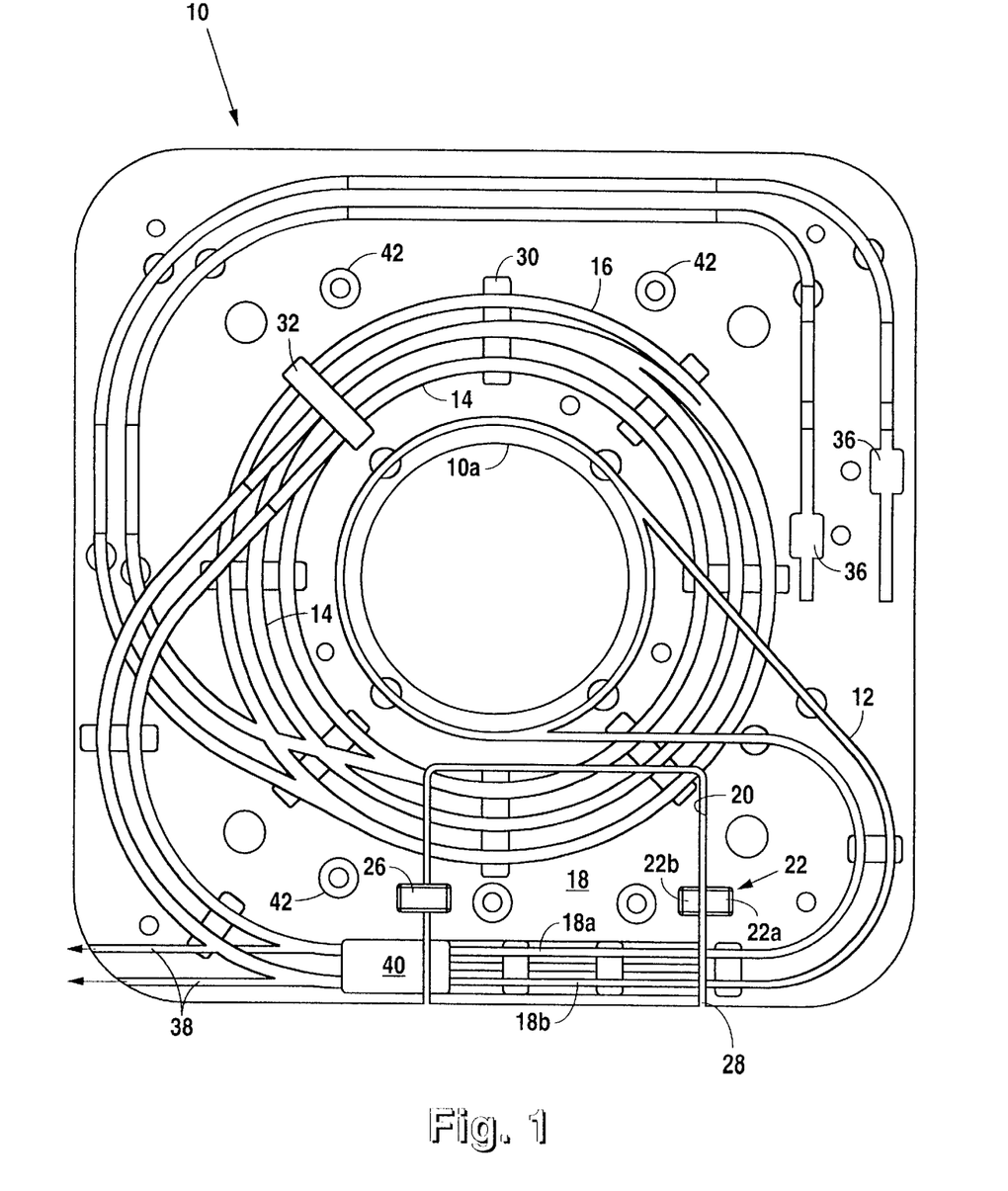
FIG. 1 is a plan view illustrating an embodiment of a fiber holding plate.

Referring to FIG. 1, an optic fiber holding plate is a generally designated 10 and includes a current conductor port 10a, a plurality of fiber channels such as sensor fiber channels 12, polarizing fiber channels 14 and an optional auxiliary fiber channel 16. An annealing insert 18 is removably mounted in an opening 20, see also FIG. 3, formed inplate 10. Insert 18 is removable to permit fibers in sensor fiber channels 12 to span opening 20 for access to a fusion splicer (not shown). Annealing insert 18, FIG. 1, includes separate fiber channels 18a, 18b. A pair of pockets 22, are formed by including a portion 22a in plate 10 and a complimentary portion 22b in insert 18. Annealing insert 18 is replaceable by packaging insert 24, FIG. 2, which is substantially the same as insert 18 except that packaging insert includes a single large channel 24a formed therein rather than separate fiber channels such as 18a, 18b in annealing insert 18. Also, both inserts 18 and 24 include portions of polarizing fiber channels 14 and auxiliary fiber channel 16.

Figure 1A:
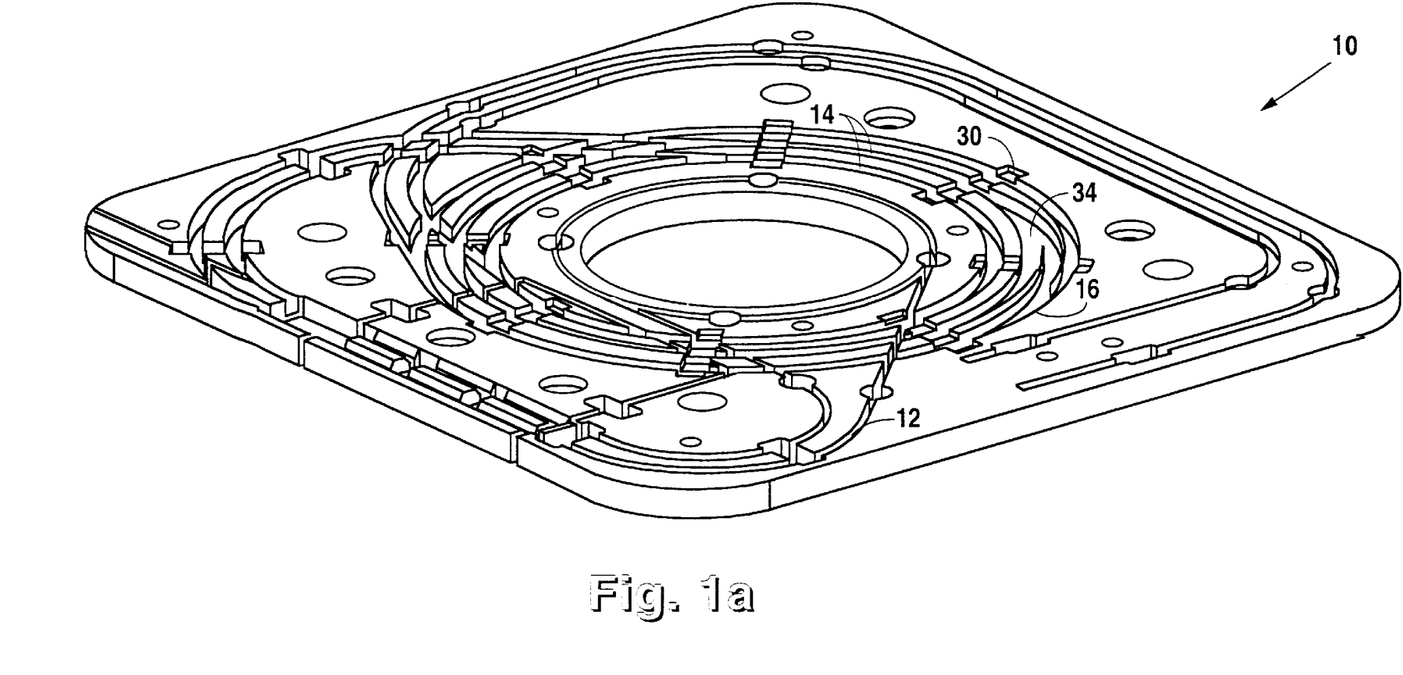
FIG. 1a is an isometric view illustrating the fiber holding plate of FIG. 1.
Figure 2:
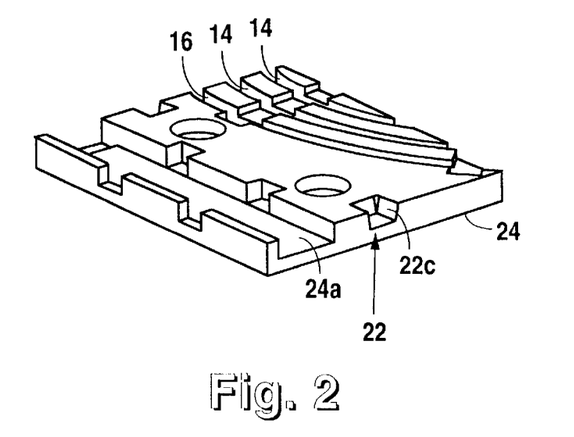
FIG. 2 is an isometric view illustrating an embodiment of a packaging insert.

Pockets 22 are tapered, i.e, the walls 22c may be tapered top to bottom as illustrated in FIG. 2, for receiving blocks 26, FIG. 1, which may be tapered, to be seated therein. This functions as a locking device to secure inserts 18 or 24 in position with plate 10. Pockets 22 are elongated and bridge or extend transversely across a gap 28 defined between opening 20 and either insert 18 or 24. A plurality of pockets 30, FIGS. 1, 1a, are provided to bridge or extend transversely across the path of sensor fiber channels 12, polarizing fiber channels 14 and auxiliary fiber channel 16. A retainer 32, FIG. 1, is provided to be seated in each pocket 30 to hold fibers close to a floor portion 34, FIG. 1a, of each respective channel. Thus, when retainers 32 are in pockets 30, fibers will be between retainers 32 and floor 34 but the retainers 32 will seat in pockets 30 spaced above floor 34 so that the fibers will be free for sufficient limited movement so as not to be jammed between retainers 32 and floor 34 within their respective channels.

Figure 6:
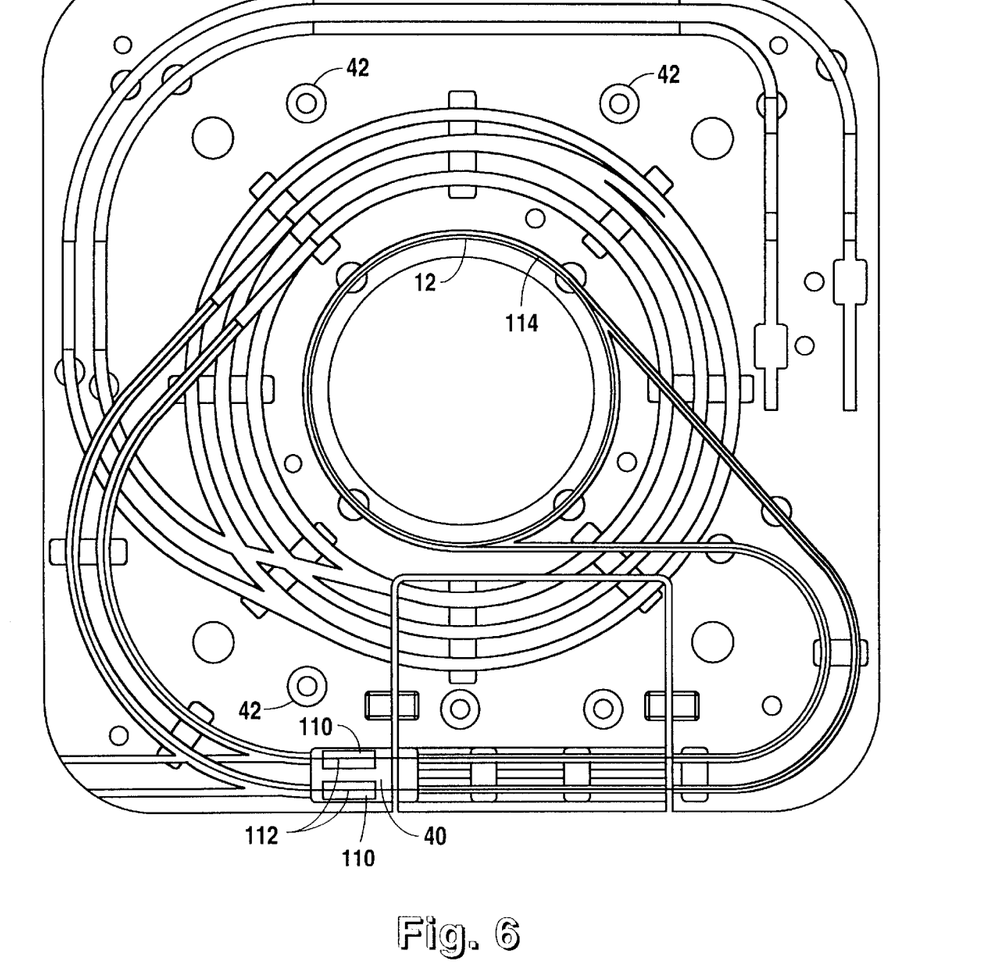
FIG. 6 is a plan view illustrating an embodiment of a fiber holding plate including a sensor fiber and quartz plates.
Figure 7:
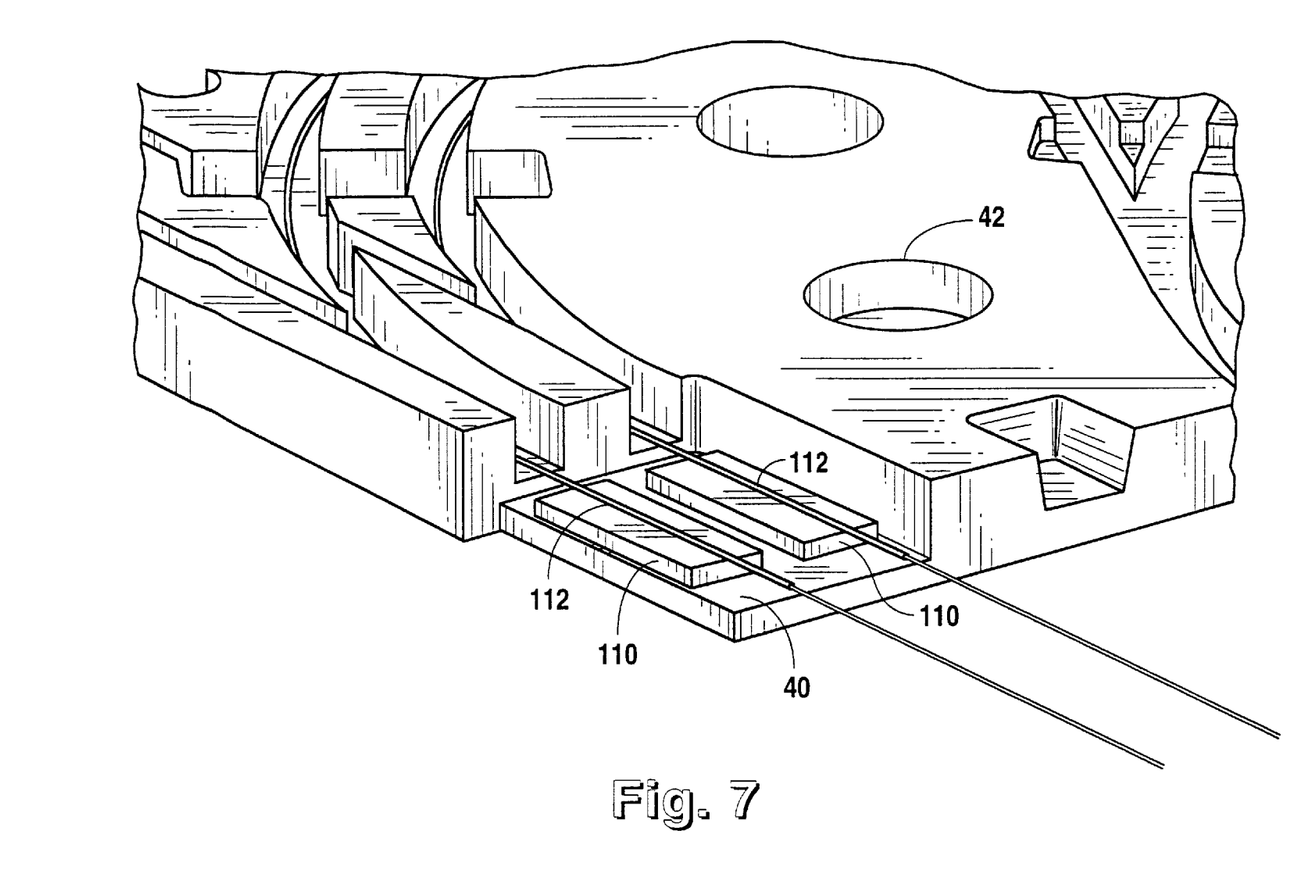
FIG. 7 is a partial isometric view illustrating the quartz plates mounted on the fiber holding plate.

Plate 10 also includes fiber jacket mount recesses 36 for receiving jacketed fibers to be discussed later. A pair of fiber channels 38 are available to lead polarizing fibers to an associated fiber annealing plate (not shown). Also, a flat reference surface 40 is provided between opening 20 and fiber channels 38 to receive quartz plates 110, FIGS. 6 and 7, to which polarizing fibers 112 can be adhered to hold their orientation after annealing. A plurality of through holes 42 are provided so that plate 10 can be screw mounted to adjacent plates, to be discussed later. Quartz plates 110, or a similar plate of low thermal expansion material, are used as a fixture to hold the orientation of the polarizing fibers 112. The fibers 112 are affixed to the quartz plates 110 using a low modulus adhesive such as Norland optical adhesive 72, available from Norland Products of N. Brunswick, N.J. The plates 110 are affixed to reference surface 40 using an adhesive such as Emcast 1060, available from Electronic Materials of New Milford, Conn. One quartz plate for each fiber 112 may be used or separate plates 110 for each fiber 112 may be used as illustrated in FIGS. 6 and 7. The dimensions of plates 110 are approximately $\frac{3}{16}"\times\frac{1}{2}"\times 0.039"$.

Figure 3:
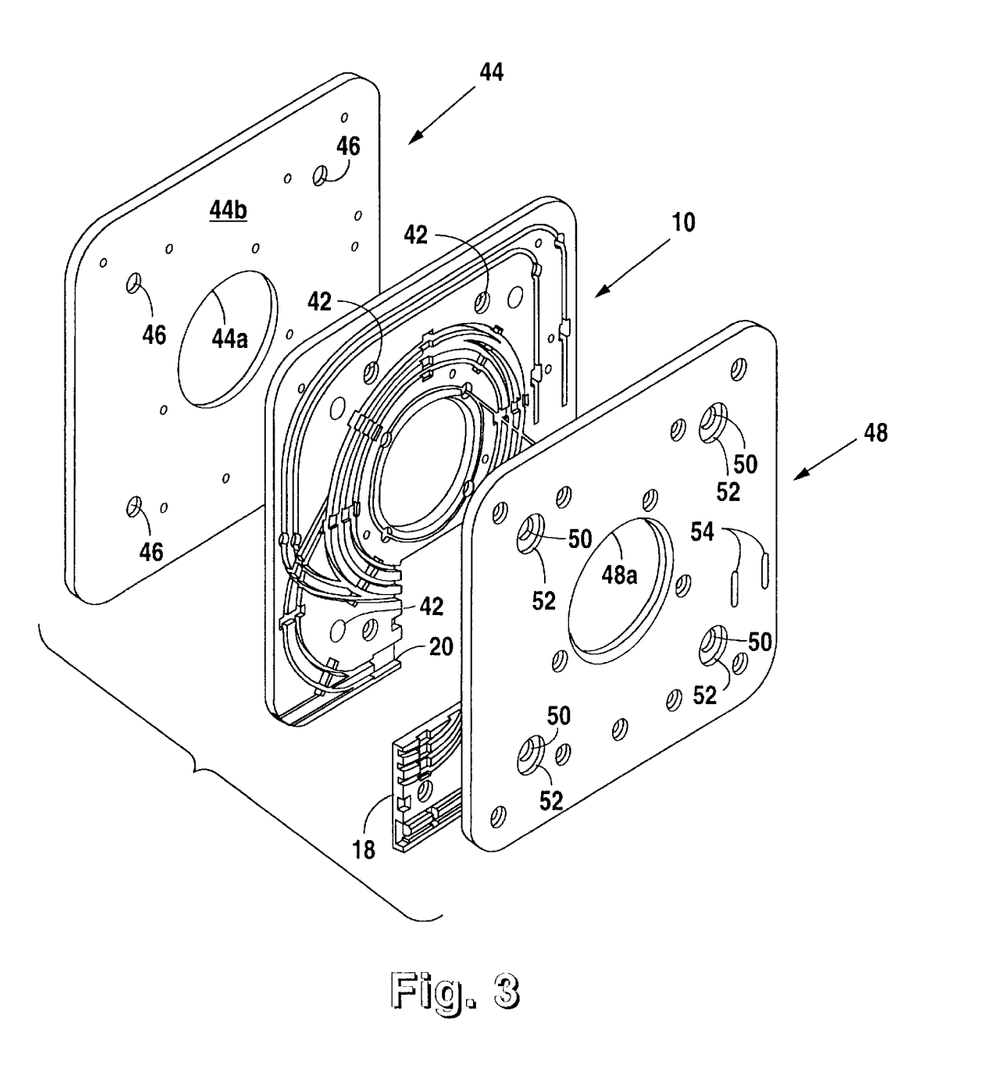
FIG. 3 is an exploded isometric view illustrating an embodiment of the fiber holding plate, a support plate and a cover plate.

A support plate 44, FIG. 3, is provided to attach to fiber holding plate 10 via well known attachment screws (not shown) which extend into a plurality of through holes 46, aligned with through holes 42 of plate 10. Also, a current conductor port 44a is provided in plate 44 in alignment with current conductor port 10a of plate 10.

A cover plate 48, FIG. 3, functions to isolate fibers which may be in fiber channels 12, 14, 16 of plate 10, from the environment. Plate 48 is also provided to attach to fiber holding plate 10 and support plate 44 via the attachment screws (not shown) which extend through a plurality of through holes 50, aligned with through holes 42 of plate 10 and through holes 46 of plate 44. Also, a current conductor port 48a is provided inplate 48 in alignment with current conductor ports 10a and 44a of plates 10 and 44 respectively. Also illustrated in FIG. 3, are a plurality of counterbores 52 concentrically aligned with through holes 50. A similar plurality of counterbores (not shown) are aligned with through holes 46 and formed in a hidden surface of support plate 44, opposite a surface 44b. In addition, a pair of angled fiber ports 54 are provided through plate 48 to permit passage of jacketed fibers which are mounted to fiber jacket mount recesses 36 in plate 10 as discussed above.

Figure 4:
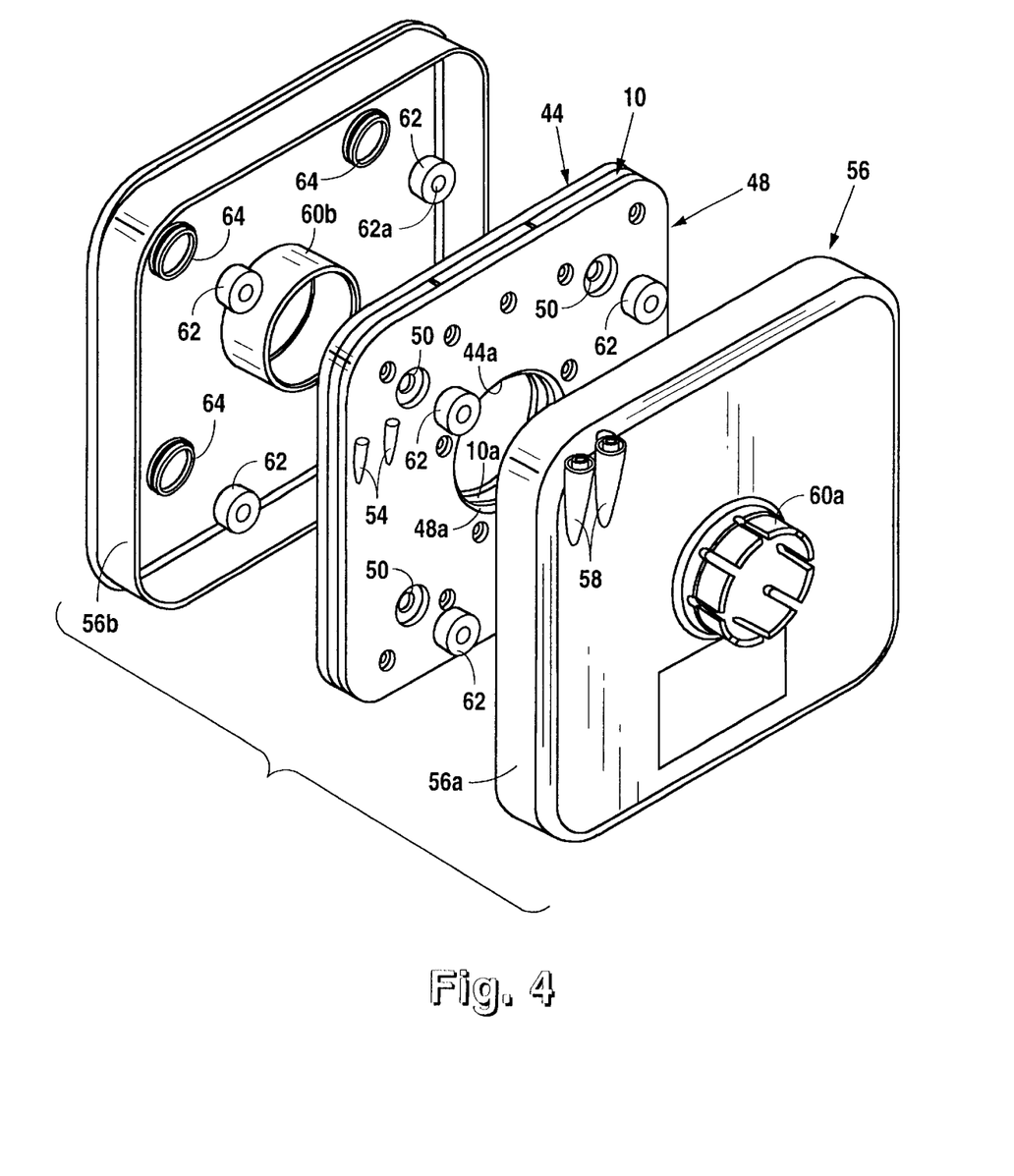
FIG. 4 is an exploded isometric view illustrating the connected plates mounted in a housing.
Figure 5:
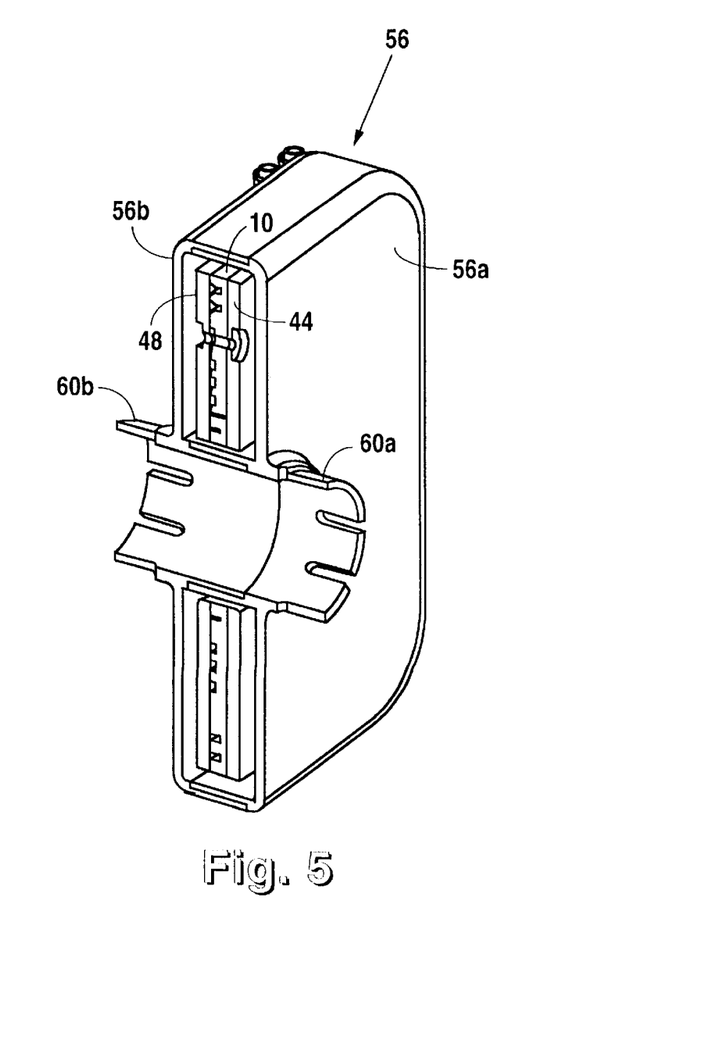
FIG. 5 is a partial isometric view illustrating the connected plates mounted in the housing.

The connected fiber holding plate 10, support plate 44 and cover plate 48, including a coextensive current conductor port formed by aligned ports 10a, 44a, 48a, respectively, can be mounted in a housing 56, FIG. 4, including separable half portions 56a and 56b, which completely enclose the connected plates 10, 44, 48, when the half portions 56a, 56b are attached, FIG. 5, by a suitable means such as an adhesive, or bolts, or the like. Housing 56 includes exit passages 58, FIG. 4, for receiving jacketed fibers from fiber ports 54 in plate 48. Passages 58 may also receive strain-relief boots (not shown) for the above-mentioned jacketed fibers. An annular guide 60a on half portion 56a and another annular guide 60b on half portion 56b, are aligned with current conductor ports 10a, 44a, 48a for accommodating a current conductor (not shown) which passes therethrough, thus permitting the housed plates to function as a fiber optic current sensor. In addition, resilient vibration isolators 62 are provided to be mounted in counterbores 50 of plate 48 and the previously mentioned counterbores in plate 44, and aligned counterbores 64 in half portion 56b and other aligned counterbores (not shown) in half portion 56a. Openings 62a in isolators 62 permit the passage of the screws which interconnect plates 10, 44 and 48 as discussed above.

Material selection for plates 10 and 44 is preferably a machinable aluminum silicate ceramic material. Plate 48 may also be of the ceramic material or can be a suitable plastic material such as a polycarbonate. Housing 56 may be formed of aluminum or a suitable polymer material such as an epoxy. Screws used to connect plates 10, 44 and 48 are preferably stainless steel or a suitable polymer material such as nylon, and the resilient vibration isolators are preferably formed of a silicon RTV.

There are many advantages which result from the embodiments disclosed herein. The ceramic package is the basic assembly for the fiber optic current sensor. It is a three layer assembly of flat ceramic plates sandwiched together to form a protective environment for the fibers. Fibers are isolated form forces resulting from handling, vibration and impact. The plates consist of a fiber-holding plate assembly which holds the fibers both for annealing and packaging. There is a support plate which is used to hold the fiber holding plate assembly together. There is a cover plate to allow for the fibers to exit the package. The ceramic package has a through-hole to allow for the current conductor to pass through. The ceramic package has features for mounting to an external housing using vibration isolators. The package may be coated to provide a vapor and moisture barrier such as a butyl rubber to enhance the reliability of the sensor. This embodiment is for use with 2" diameter round conductors. The package is 8"×8" and each layer is 0.25" thick for an overall thickness of 0.75". The ceramic is a machinable aluminum silicate. Castable cordierite and castable silica plates could also be used. The ceramic must withstand repeated exposure to temperatures up to 1000° C.

The fiber holding plate subassembly functions as the annealing mold and as the fiber package. The subassembly consists of a main plate which receives a ceramic annealing insert. The annealing insert is removable to allow for the fusion splicing. There are two inserts. The other is used for the final packaging. There are tapered pockets which bridge the main plate and the insert to lock the assembly during the fiber annealing.

Flat channels are used to hold the annealing fiber, the polarizing fibers, and auxiliary fibers such as fiber depolarizer. Separate polarizing fiber channels avoid stacking of the polarizing fiber coils and reduces the preload on the fibers. Recesses or pockets along the fiber channels receive retainers which hold the fibers close to the channel floor and limits the out-of-plane movement of the fiber thus reducing vibration sensitivity. Out-of-plane movement and vibration sensitivity of the annealed fiber is further restrained by the use of high viscosity silicon oil, FIG. 6, placed directly on the fiber. The silicon oil functions as a vibration damping agent and is applied in sensor fiber channel 12, FIG. 6. The oil wets a sensor fiber 114 to the base of channel 12 due to the surface tension of the silicon oil. Other materials or methods may be suitable to achieve the same result. The polarizing fiber channels must have a minimum bend radius of 1.75" but generally a 2" radius is used.

The fiber holding plate of the ceramic subassembly also has a flat reference surface for attachment of the quartz plates, described above, and is used to define the relative orientation of the polarizing fibers. The plate also has features to mount the jacketed fiber.

The support plate functions to lock the fiber holding plate subassembly. The ceramic material of the support plate should match the fiber holding plate subassembly material. There are counterbored holes to receive the vibration isolators and to allow for optional external housing clamping screws.

The cover plate functions to isolate the fibers from the environment. There are angled through-holes for the passage of the jacketed fiber. There are counterbored holes to receive the vibration isolators and to allow for optional external housing clamping screws. The cover plate material may match the ceramic or it may be made from a plastic.

Although illustrative embodiments of the invention have been shown and described, a wide range of modifications, change and substitution is contemplated in the foregoing disclosure and in some instances, some features of the present invention may be employed without a corresponding use of other features. Accordingly, it is appropriate that the appended claims be construed broadly and in a manner consistent with the scope of the invention.

What is claimed is:

1. A fiber optic current sensor comprising:
   a support plate;
   a fiber holding plate connected to the support plate including sensor and polarizing fiber channels formed therein, the fiber holding plate including a removably mounted insert;
   a cover plate connected to the fiber holding plate; and
   a housing for receiving the connected plates, the housing and plates having a coextensive conductor port extending therethrough, the housing including vibration mounts for isolating vibration within the housing.

2. The current sensor as defined in claim 1 wherein the fiber holding plate is formed of a material which may be repeatedly exposed to temperatures up to 1000° C.

3. The current sensor as defined in claim 1 further comprising means for locking the insert to the fiber holding plate.

4. The current sensor as defined in claim 1 further comprising retainer means for retaining fibers in the channels.

5. The current sensor as defined in claim 1 further comprising a flat reference surface for maintaining orientation for polarizing fibers in the polarizing fiber channels.

6. The current sensor as defined in claim 5 further comprising at least one quartz plate attached to the flat reference surface to hold orientation of fibers attached thereto.

7. The current sensor as defined in claim 1 further comprising fiber ports formed in the cover plate.

8. The current sensor as defined in claim 1 further comprising silicon oil applied in the sensor fiber channel for restricting out of plane movement of a fiber mounted therein.

* * * * *

UNITED STATES PATENT AND TRADEMARK OFFICE
CERTIFICATE OF CORRECTION

PATENT NO.: 5,999,668

DATED: December 7, 1999

INVENTOR(S): Edward Hernandez, Trevor Wayne MacDougall, John Anthony Valenti, Jay Walter Dawson and Leonard Andrew Johnson

It is certified that error appears in the above-identified patent and that said Letters Patent is hereby corrected as shown below:

[75] Inventors: Edward Hernandez, Austin, Tex.;
Trevor Wayne MacDougall, Simsbury, Conn.;
John Anthony Valenti, Round Rock, Tex.;
Jay Walter Dawson, Round Rock, Tex.;
Leonard Andrew Johnson, Austin, Tex.

Signed and Sealed this

Tenth Day of April, 2001

Attest:

NICHOLAS P. GODICI

Attesting Officer

Acting Director of the United States Patent and Trademark Office